United States Patent [19]

Takemura

[11] Patent Number: 5,268,060
[45] Date of Patent: Dec. 7, 1993

[54] METHOD OF MANUFACTURING OXIDE SUPERCONDUCTING MATERIALS

[75] Inventor: Yasuhiko Takemura, Atsugi, Japan

[73] Assignee: Semiconductor Energy Laboratory Co., Ltd., Kanagawa, Japan

[21] Appl. No.: 912,663

[22] Filed: Jul. 14, 1992

Related U.S. Application Data

[60] Continuation of Ser. No. 666,920, Mar. 11, 1991, abandoned, which is a division of Ser. No. 372,473, Jun. 28, 1989, Pat. No. 5,032,571.

[30] Foreign Application Priority Data

| Jul. 5, 1988 | [JP] | Japan | 63-167059 |
| Jul. 5, 1988 | [JP] | Japan | 63-167060 |
| Nov. 2, 1988 | [JP] | Japan | 63-277711 |
| Jan. 13, 1989 | [JP] | Japan | 1-6375 |
| Jan. 13, 1989 | [JP] | Japan | 1-6376 |
| Jun. 5, 1989 | [JP] | Japan | 1-143558 |

[51] Int. Cl.$^5$ .............................. C01F 11/02
[52] U.S. Cl. .................. 156/600; 156/617.1; 505/1; 505/729
[58] Field of Search ............... 156/600, 617.1; 505/1, 505/729

[56] References Cited

U.S. PATENT DOCUMENTS

| 4,939,308 | 7/1990 | Maxfield et al. | 505/729 |
| 4,942,142 | 7/1990 | Itozaki et al. | 505/1 |
| 4,942,152 | 7/1990 | Itozaki et al. | 505/1 |

FOREIGN PATENT DOCUMENTS 1088467  9/1960  Fed. Rep. of Germany ... 156/617.1

OTHER PUBLICATIONS

"Epitaxial Ordering of Oxide Superconductor Thin Films on (100) $SrTiO_3$ Prepared by Pulsed Laser Evaporation"; Wu et al; Appl. Phys. Lett. 51(11), 14 Sep. 87 pp. 861–863.
Crystallization of High Temperature Superconductors from Non-Stoichiometric Melts; Bykov, A. B. et al; Journal of Crystal Growth (91) (1988) pp. 302–307.

Primary Examiner—Olik Chaudhuri
Assistant Examiner—Felisa Garrett
Attorney, Agent, or Firm—Sixbey, Friedman, Leedom & Ferguson

[57] ABSTRACT

Superconducting ceramics are produced in crystalline form by, for example, the crystal pulling technique. The seed crystal is prepared from another ceramic material which is non-superconducting but has a similar molecular structure as the superconducting ceramic to be formed. By virtue of the similarity in the crystalline structure, single crystals of superconducting ceramics can be easily produced on the seed crystal.

4 Claims, 8 Drawing Sheets

F I G. 2
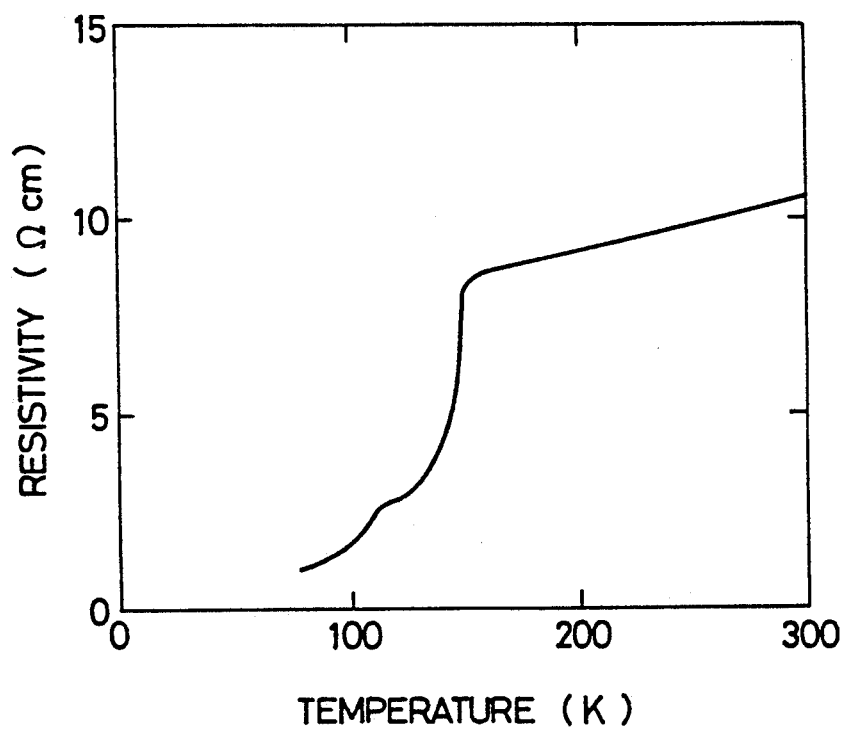

METHOD OF MANUFACTURING OXIDE SUPERCONDUCTING MATERIALS

This application is a continuation of Ser. No. 07/666,920, filed Mar. 11, 1991, now abandoned, which itself was a divisional of Ser. No. 07/372,473, filed Jun. 28, 1989, now U.S. Pat. No. 5,032,571.

BACKGROUND OF THE INVENTION

The present invention relates to a method of manufacturing oxide superconductor elements, and more particularly to a method of manufacturing Bi-based superconducting ceramic materials.

Recently, superconducting ceramics comprising Bi have been discovered as promising materials which can be formed to have high Tc. The Bi-based superconducting material takes two phases, in one of which, called the low Tc phase, the critical temperature reaches up to 80° K., and in the other, called the high Tc phase, the critical temperature reaches up to 110° K. An example of the stoichiometric formula of the low Tc ceramic is $Bi_2Sr_2CaCu_2O_{8-x}$ having its c-axis length of 30 Å. An example of the stoichiometric formula of the high Tc ceramic is $Bi_2Sr_2Ca_2Cu_3O_{10-x}$ having its c-axis length of 36 Å. In this low Tc phases, there are formed three CuO planes within one unit structure thereof. In accordance with recent reports, there are other phases having their c-axes of 42 Å and 48 Å in which phases there are formed CuO-(Sr, Ca) planes in addition to the three CuO plane. It is believed for this reason that the resistivity of Bi-based superconductors begins to fall down at 150 K. or higher temperatures.

In spite of past efforts, it has been still difficult to increase the proportion of the high TC phase in the formation of Bi-based superconducting ceramics. Also, single crystals of the high Tc phase have not be formed yet.

SUMMARY OF THE INVENTION

It is therefore an object of the present invention to provide a method of producing high Tc superconducting ceramic materials.

In order to accomplish the above and other objects and advantages, seed crystals or substrate are prepared from other materials which can be easily formed to have molecular structures similar as superconducting ceramics. For example, Bi-based layered dielectrics expressed by the general formula, $(Bi_2O_2)(A_{m-1}B_mO_{3m+1})$ where $m > 1$, tend to have very similar structure as superconducting ceramics. The a-axis lengths and the b-axis lengths thereof are almost equal to those of Bi-based superconducting ceramics. In this formula, A stands for an alkali earth metal such as Ca. B stands for a rear earth metal such as Ti. These oxides are not superconducting ceramics while the formation is easier than that of superconducting ceramics. Among these are $Bi_2(Sr_{1-x}La_x)_4Cu_3O_y$ ($x=0.05-0.4$, $y=8-12$; c-axis length is 32.8 Å), $Bi_4Ti_3O_{12}$ (c-axis length is 32.8 Å), $CaBi_4Ti_4O_{15}$ (c-axis length is 41-42 Å), $SrBi_4Ti_4O_{15}$ (c-axis length is 41-42 Å), $BaBi_4Ti_4O_{15}$ (c-axis length is 41-42 Å), $PbBi_4Ti_4O_{15}$ (c-axis length is 41-42 Å), $Sr_2Bi_4Ti_5O_{18}$ (c-axis length is 48.8 Å), $Ba_2Bi_4Ti_5O_{18}$ (c-axis length is 50.3 Å), $Pb_2Bi_4Ti_5O_{18}$ (c-axis length is 49.7 Å), When a superconducting ceramic material is desired to be formed, a suitable ceramic material (called seed ceramic material) is first selected, e.g. among from the above material to have its c-axis length close to that of the superconducting ceramic material to be formed thereon. On the other hand, superconducting $Bi_2(Sr, Ca)_6Cu_5O_{14+x}$ has its c-axis length of 48 Å. According to this method, the high Tc phase can be selectively formed on the seed ceramic.

Alternatively, the seed ceramic material can be selected to have its c-axis length which constitutes a simple ratio, such as n/m (n and m are integers), to the c-axis length of the superconducting ceramic material to be formed. For example, it was observed that the high Tc phase of 36 Å c-axis length was selectively grown by virtue of the existence of a semiconductor phase of 24 Å c-axis length. Namely, 24:36=2:3. Ceramics whose c-axis lengths constitute simple ratio to those of superconducting ceramics are, for example, $Bi_3TiNbO_9$ (c-axis length is 25 Å), $Bi_3TiTaO_9$ (c-axis length is 25 Å), $Bi_3Ti_4NbO_9$ (c-axis length is 25 Å), $CaBi_2Nb_2O_9$ (c-axis length is 25 Å), $Bi_3TiTaO_9$ (c-axis length is 25 Å), $CaBi_2Ta_2O_9$ (c-axis length is 25 Å), $SrBi_2Nb_2O_9$ (c-axis length is 25 Å), $SrBi_2Ta_2O_9$ (c-axis length is 25 Å), $Ba_2Bi_2Nb_2O_9$ (c-axis length is 25 Å), $CaSr_2Bi_4Ti_5O_{18}$ (c-axis length is 49-50 Å), $Sr_2Bi_4Ti_5O_{18}$ (c-axis length is 49-50 Å), $Ba_2Bi_4Ti_5O_{18}$ (c-axis length is 49-50 Å), $Pb_2Bi_4Ti_5O_{18}$ (c-axis length is 49-50 Å).

Furthermore, the inventor has found new compound oxide materials, which can be represented generally by the formula $Bi_2LaCa_nCu_nO_y$ ($n=1$, 2 or 3; $y=8-12$, called BLCCO hereafter) and have same molecular structures as Bi-based superconducting ceramics. The seed crystals of this type could be effectively used for forming single crystals of the superconducting ceramics. The a-axis length and the b-axis length of the seed ceramics are same as the Bi-based superconducting ceramics. The c-axis length is 24 Å ($n=1$), 30 Å ($n=2$) and 36 Å ($n=3$), which are equal to the corresponding figures of superconducting ceramics in the form of $Bi_2Sr_2Ca_{n-1}Cu_nO_y$ ($n=1$, 2 or 3, $y=8-12$). With this seed crystals, single crystalline BLCCO can be formed on the order of 2 cm.

BRIEF DESCRIPTION OF THE DRAWING

This invention can be better understood from the following detailed description when read in conjunction with the drawing in which

FIG. 2 is a graphical diagram showing the resistivity of a superconducting ceramic with changing temperature in accordance with the present invention.

DETAILED DESCRIPTION OF THE PREFERRED EMBODIMENTS

Hereinbelow, several experiments are illustrated in accordance with embodiments of the present invention making use of the screen press printing.

EXPERIMENT 1

$Bi_2O_3$ and $TiO_2$ powders of 99.9% purity were prepared and mixed with each other. After firing at 800° C. for 12 hours in air, the mixture was compacted into a circular tablet of 1 mm thickness and 20 mm diameter. The tablet was fired again at 1000° C. for 12 hours in air. It was confirmed by means of x-ray diffraction that the stoichiometric composition of the tablet was in the single phase of $Bi_4Ti_3O_{12}$. The c-axis length of $Bi_4Ti_3O_{12}$ is 32.8 Å.

Figure 1:
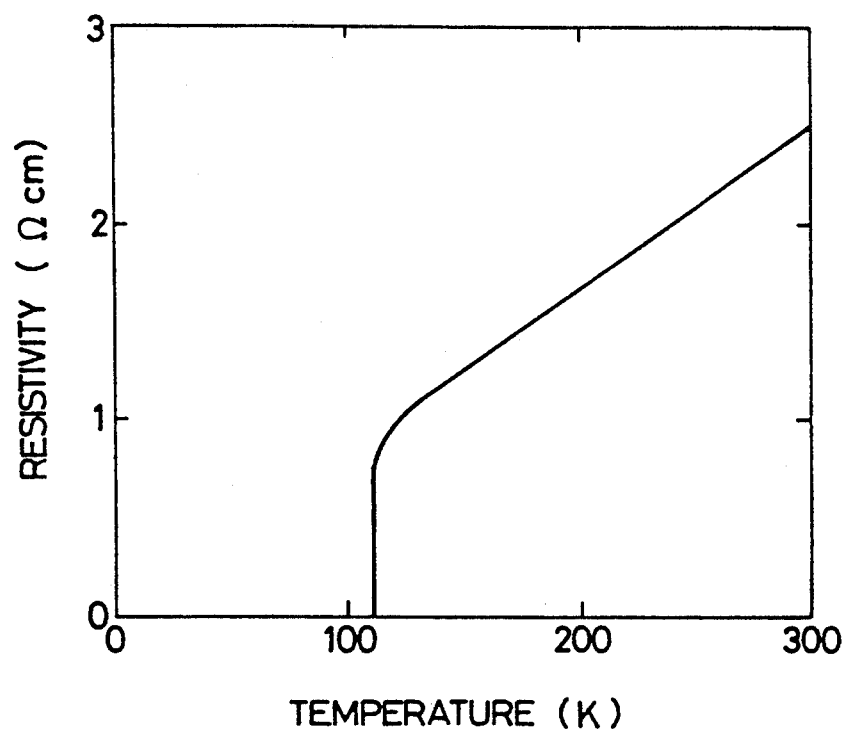
FIG. 1 is a graphical diagram showing the resistivity of a superconducting ceramic with changing temperature in accordance with the present invention.

Next, $Bi_2O_3$, $SrCO_3$, $CaCO_3$ and $CuO$ in prescribed amount were prepared in powder form (99.9% purity) and mixed with each other so that Bi:Sr:Ca:Cu=2:2:2:3. The mixture was fired at 800° C. for 12 hours in air and ground into powders of 1-5 micrometers average diameter. The powders were mixed with ethanol and applied to the surface of the $Bi_4Ti_3O_{12}$ tablet in film form by screen printing. The film was fired at 900° C. for 30 min and gradually cooled at 60° C./hour to room temperature. The thickness of the film was measured to be 30 micrometers. The c-axis was measured to be 36 Å. FIG. 1 shows the resistivity of the film versus the temperature. As shown in the figure, the critical temperatuer was 110° K. In accordance with the X-ray diffraction, the film was proved to be in the high Tc phase of $Bi_2Sr_2Ca_3O_{10+x}$. The critical supercoducting current density was measured to be 50,000 Å/cm$^2$.

EXPERIMENT 2

$SiCO_3$, $Bi_2O_3$ and $TiO_2$ powders of 99.9% purity were prepared and mixed with each other. After firing at 800° C. for 12 hours in air, the mixture was compacted into a circular tablet of 1 mm thickness and 20 mm diameter. The tablet was fired again at 1000 ° C. for 12 hours in air. It was confirmed by means of x-ray diffraction that the stoichiometric composition of the tablet was $Sr_2Bi_4Ti_5O_{18}$ including a few amount of $Sr_2Bi_4Ti_4O_{15}$. The c-axis length of $Sr_2Bi_4Ti_5O_{18}$ is 49-50 Å.

Figure 3:
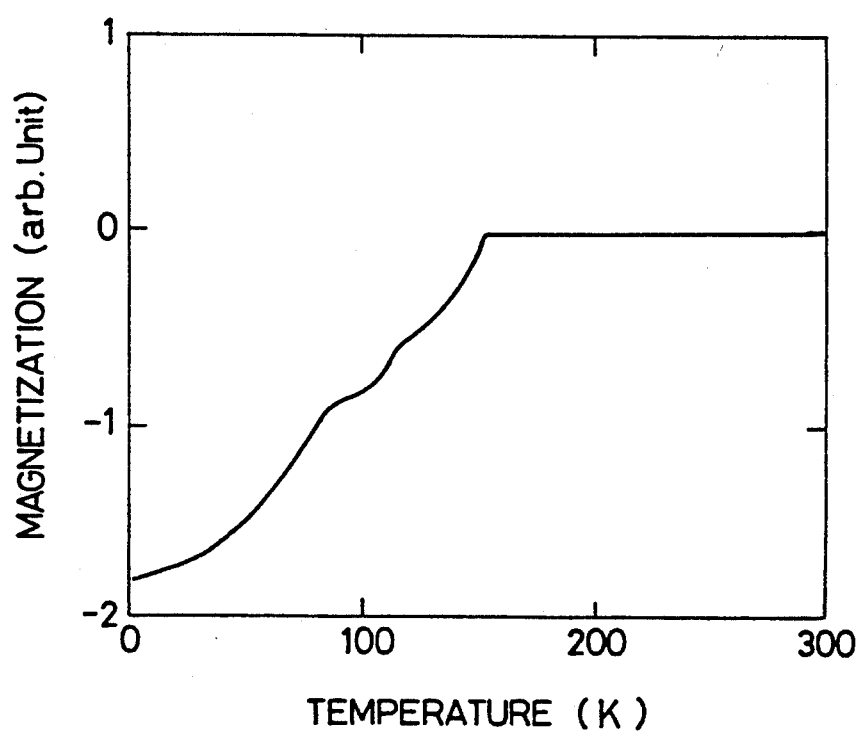
FIG. 3 is a graphical diagram showing the magnetization of a superconducting ceramic with changing temperature in accordance with the present invention.

Next, $Bi_2O_3$, $SrCO_3$, $CaCO_3$ and $CuO$ in prescribed amount were prepared in powder form (99.9% purity) and mixed with each other so that Bi:Sr:Ca:Cu=2:3:3:5. The mixture was fired at 800° C. for 12 hours in air and ground into powders of 1-5 micrometers average diameter. The powders were mixed with ethanol and applied to the surface of the $Sr_2Bi_4Ti_5O_{18}$ tablet in film form by screen printing. The film was fired at 900° C. for 30 min and gradually cooled at 60° C./hour to room temperature. The thickness of the film was measured to be 30 micrometers. The c-axis was measured to be not shorter than 40 Å. FIG. 2 shows the resistivity of the film versus the temperature. As shown in the figure, the critical temperatuer was 110° K. In accordance with the X-ray diffraction, the film was proved to be in the high Tc phase of $(Bi_2O_2)(Sr_3Ca_3Cu_5O_{18+x})$. Meisner effect was confirmed by measuring magnetization using a SQUID. Namely, as illustrated in FIG. 3, the magnetization became negative when cooled below about 150 K. The proportion of the high Tc phase (Tc=150 K) was estimated by the magnetization at 3 to 8%. The critical superconducting current density was measured to be 50,000 Å/cm$^2$.

EXPERIMENT 3

$Nb_2O_5$, $Bi_2O_3$ and $TiO_2$ powders of 99.9% purity were prepared and mixed with each other. After firing at 800° C. for 12 hours in air, the mixture was compacted into a circular tablet of 1 mm thickness and 20 mm diameter. The tablet was fired again at 1000° C. for 12 hours in air. It was confirmed by means of x-ray diffraction that the stoichiometric composition of the tablet was in the single phase of $Bi_3TiNbO_9$. The c-axis length of $Bi_3TiNbO_9$ is 25.1 Å.

Figure 4:
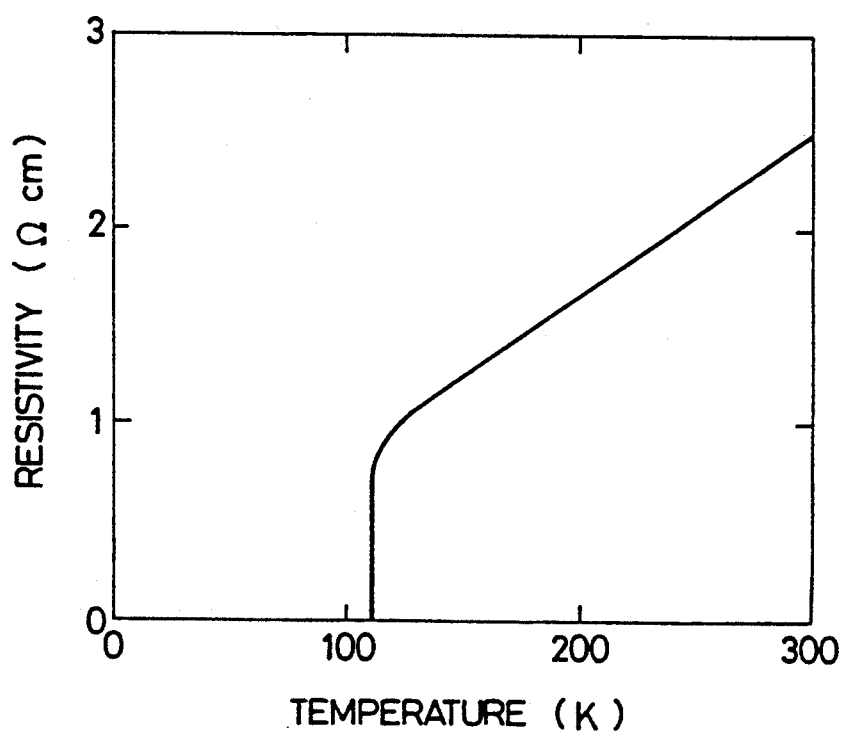
FIG. 4 is a graphical diagram showing the resistivity of a superconducting ceramic with changing temperature in accordance with the present invention.

Next, $Bi_2O_3$, $SrCO_3$, $CaCO_3$ and $CuO$ in prescribed amount were prepared in powder form (99.9% purity) and mixed with each other so that Bi:Sr:Ca:Cu=2:2:2:3. The mixture was fired at 800° C. for 12 hours in air and ground into powders of 1-5 micrometers average diameter. The powders were mixed with ethanol and applied to the surface of the $Bi_3TiNbO_9$ tablet in film form by screen printing. The film was fired at 900° C. for 30 min and gradually cooled at 60° C./hour to room temperature. The thickness of the film was measured to be 30 micrometers. The c-axis was measured to be 36 Å. FIG. 4 shows the resistivity of the film versus the temperature. As shown in the figure, the critical temperatuer was 110° K. In accordance with the X-ray diffraction, the film was proved to be in the high Tc phase of $Bi_2Sr_2Ca_3O_{10+x}$. The critical superconducting current density was measured to be 50,000 Å/cm$^2$.

The superconducting ceramic can be formed in accordance with the present invention by the crystal pulling technique as described in the followings.

EXPERIMENT 4

$Bi_2O_3$ and $TiO_2$ powders of 99.9% purity were prepared and mixed with each other. The mixture was kept in a crucible made of alumina at 1200° C. for seven days, and then crushed, from which crushed material a seed crystal of $Bi_4Ti_3O_{12}$ was selected and taken up. The size of the crystal was of the order of about 3 mm × 3 mm × 1 mm.

Next, $Bi_2O_3$, $SrCO_3$, $CaCO_3$ and $CuO$ in prescribed amount were prepared in powder form (99.9% purity) and mixed with each other so that Bi:Sr:Ca:Cu=4:2:2:3. The mixture was fired at 800° C. for 12 hours in air and molten in a crucial at 890° C. A superconducting crystal was produced from the fired mixture by the crystal pulling technique.

Figure 5:
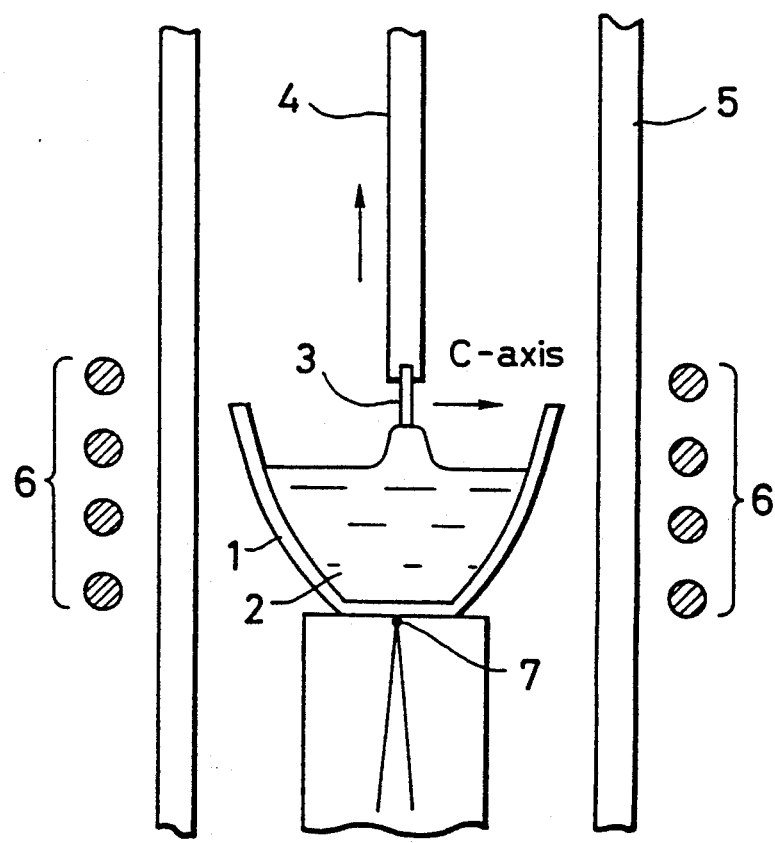
FIG. 5 is a shematic diagram showing a crystal pulling apparatus.

FIG. 5 illustrates the furnace construction which was used for the crystal growth in accordance with the present invention. The ceramic mixture 2 was placed in a crucible 1 seated on a ceramic base. A thermocouple is embedded in the base in order to measure the temperature of the crucible 1. A quartz tube was provided surrounding the base and the crucible. A r.f. coil 6 outside the tube then completes the assembly.

Figure 6:
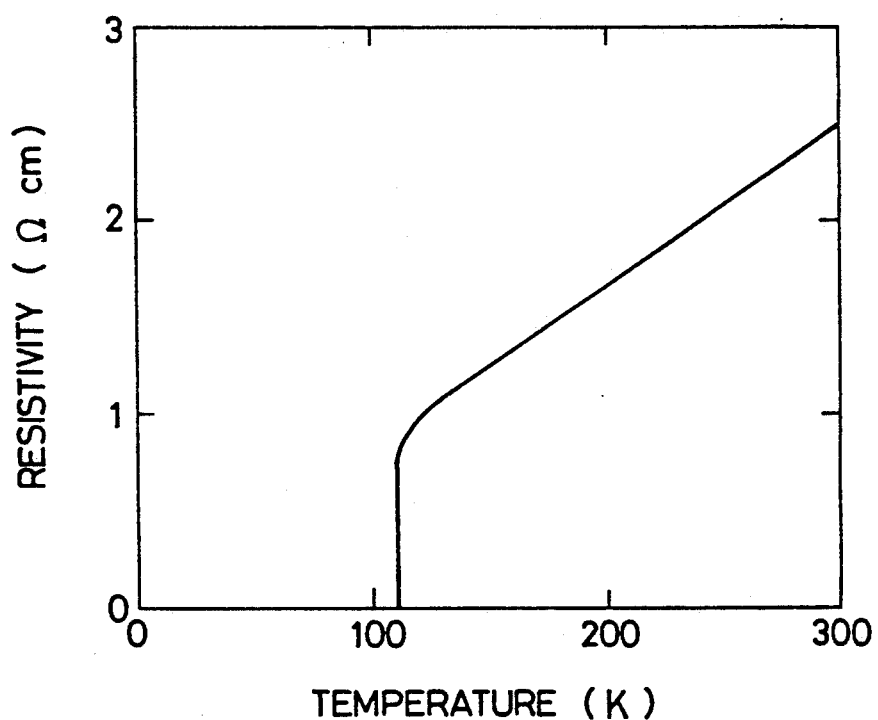
FIG. 6 is a graphical diagram showing the resistivity of a superconducting ceramic with changing temperature in accordance with the present invention.

The charge in the crucible 1 was molten at 890° C. The seed crystal was supported by a rod 4 so that its c-axis was oriented parallel with the surface of the molten ceramic. Then the seed crystal was pulled up at 5 mm/hour. As a result, a single crystalline Bi-based superconducting ceramic as large as 5 mm × 30 mm × 0.5 mm was obtained. FIG. 6 shows the resistivity of the film versus the temperature. As shown in the figure, the critical temperature was 110° K. The critical superconducting current density was measured to be 50,000 Å/cm$^2$.

EXPERIMENT 5

$Bi_2O_3$, $La_2O_3$, $CaCO_3$ and CuO powders of 99.9% purity were prepared and mixed with each other so that Bi:La:Ca:Cu=2:1:2:1. The mixture was kept in a crucible made of alumina at 1000° C. for an hour, followed by gradual cooling at 10° C./hour, and then crushed, from which crushed material a seed crystal of $Bi_2LaCa_2Cu_2O_y$ was selected and taken up. The size of the crystal was about 3 mm×3 mm×1 mm.

Next, $Bi_2O_3$, $SrCO_3$, $CaCO_3$ and CuO in prescribed amount were prepared in powder form (99.9% purity) and mixed with each other so that Bi:Sr:Ca:Cu=1:1:1:3. The mixture was fired at 800° C. for 12 hours in air and molten in a crucible at 890° C. A superconducting crystal was produced from the molten raw material by the crystal pulling technique.

Figure 7:
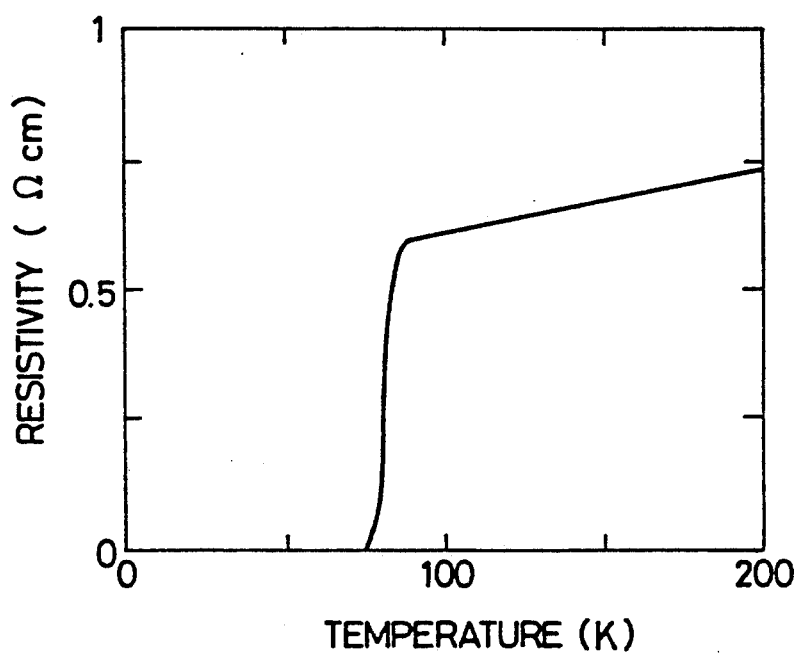
FIG. 7 is a graphical diagram showing the resistivity of a superconducting ceramic with changing temperature in accordance with the present invention.

The charge in the crucible was molten at 890° C. The seed crystal was supported by a rod 4 so that its c-axis was adjusted parallel with the surface of the molten ceramic. Then the seed crystal was pulled up at 5 mm/hour. As a result, a single crystalline Bi-based superconducting ceramic as large as 20 mm×20 mm×0.5 mm was obtained. FIG. 7 shows the resistivity of the film versus the temperature. As shown in the figure, the critical temperatuer was 82° K. The critical supercoducting current density was measured to be 10,000 $Å/cm^2$.

EXPERIMENT 6

The ceramics represented by $Bi_2(Sr_{1-x}La_x)_4Cu_3O_y$ (x=0.05-0.4, y=8-12; c-axis length is 32.8 Å) have the same sturcture as the high Tc phase of the Bi-based superconducting ceramics. The a-axis and b-axis lengths are 5.4 Å and 3.6 Å, which are equal to the corresponding figures of the Bi-based superconducting ceramics. These materials, however, can not exhibit superconductivity since the carrier density therein is too low.

The $Bi_2(Sr_{1-x}La_x)_4Cu_3O_y$ ceramic was prepared by flux method with CuO as a melting agent. First, $Bi_2O_3$, $SrCO_3$, $La_2O_3$, and CuO powders of 99.9% purity were prepared and mixed with each other so that Bi:Sr:La:Cu=2:3.5:0.5:3. The mixture was placed in a crucible and fired at 1000° C. for 5 hours followed by gradual cooling to 800° C. at 10° C./hour. Then, the cooled charge was crushed in order to pick up a suitable seed crystal therefrom.

Next, $Bi_2O_3$, $SrCO_3$, $CaCO_3$ and CuO in prescribed amount were prepared in powder form (99.9% purity) and mixed with each other so that Bi:Sr:Ca:Cu=4:2:2:3. The mixture was fired at 800° C. for 12 hours in air and molten in a crucible at 890° C. A superconducting crystal was produced from the molten material by the crystal pulling technique.

The charge in the crucible was molten at 890° C. The seed crystal was supported by a rod 4 so that its c-axis was adjusted parallel with the surface of the molten ceramic. Then the seed crystal was pulled up at 5 mm/hour. As a result, a single crystalline Bi-based superconducting ceramic of 5 mm×50 mm×0.5 mm was obtained. The critical temperature was measured to be 106° K. The critical superconducting current density was measured to be 50,000 $Å/cm^2$.

The superconducting ceramic can be formed in accordance with the present invention by the laser sputtering technique as described in the followings.

EXPERIMENT 7

Figure 8:
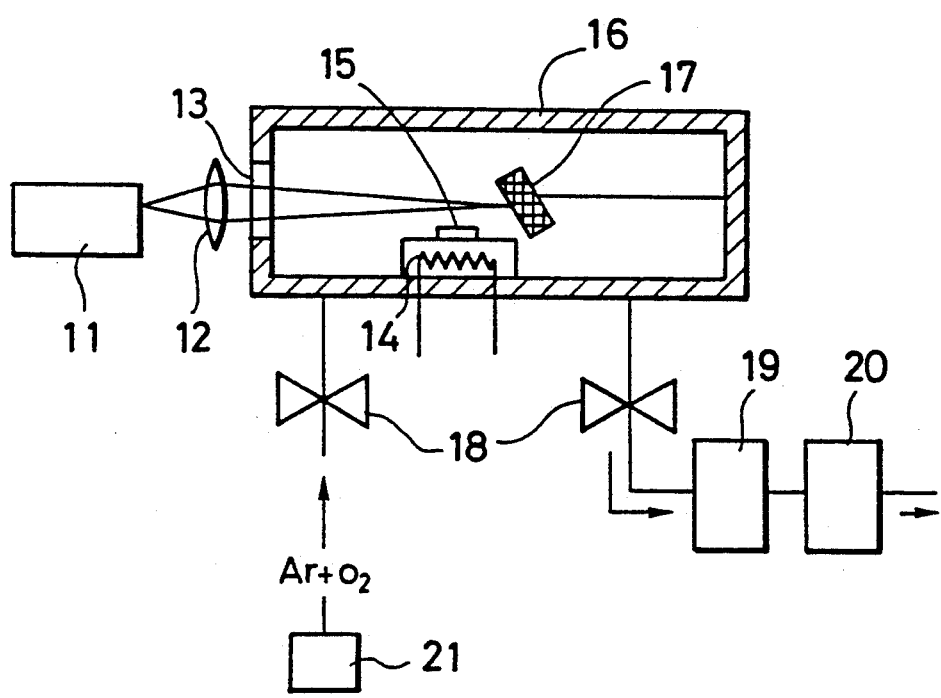
FIG. 8 is a schematic diagram showing an laser sputtering apparatus for use in an embodiment of the present invention.

$Bi_2O_3$, $SrCO_3$, $La_2O_3$, and CuO powders of 99.9% purity were prepared and mixed with each other so that Bi:Sr:La:Cu=2:3.5:0.5:3. The mixture was compressed into a tablet and fired at 850° C. for 24 hours. Then a substrate of $Bi_2(Sr_{1-x}La_x)_4Cu_3O_y$ was obtained. The substrate was disposed in a laser sputtering apparatus illustrated in FIG. 8. The apparatus comprises a vacuum chamber 16, a gas feeding system 21, an exhaustion system comprising a turbo molecular pump 19 and a rotary pump 20, a substrate holder provided with a heater 14 therein, an eximer laser 11 and an associated lens 12 which focuses the laser rays emitted from the laser 11 throught a light window 3 to a target 17 appropriately positioned in the chamber. The target 17 was prepared from a Bi-based superconductor of $Bi_2Sr_2Ca_2Cu_3O_y$ in accordance with the foregoing description.

After introducing argon and oxygen at $Ar:O_2=4:1$ and maintaining the whole pressure at 0.1 Torr, the target 17 was slowly disintegrated due to bombardment by laser rays and the material of the target was deposited on the substrate 15 of $Bi_2(Sr_{1-x}La_x)_4Cu_3O_y$. The substrate temperature was adjusted at 650° C. by means of the heater 14. The deposition speed was about 10 nm/min. The thickness of the deposited film was 500 nm. Through the measurement of resistivity, Tc was measured to be 106K. This high Tc was attributed to the high Tc phase.

EXPERIMENT 8

The ceramics represented by $Bi_2Sr_4Fe_3O_y$ (y=8-12) have the same sturcture as the high Tc phase of the Bi-based superconducting ceramics. The a-axis and b-axis lengths are 5.4 Å and 3.6 Å, which are equal to the corresponding figures of the Bi-based superconducting ceramics. In this ceramic structure, Fe and Sr atoms replace Cu and Ca sites of the Bi-based superconducting ceramics.

$Bi_2O_3$, $SrCO_3$, $La_2O_3$, and CuO powders of 99.9% purity were prepared and mixed with each other so that Bi:Sr:La:Cu=2:3.5:0.5:3. The mixture was compressed into a tablet and fired at 850° C. for 24 hours. Then a substrate of $Bi_2Sr_4Fe_3O_y$ was obtained. This substrate was disposed in a laser sputtering apparatus illustrated in FIG. 8. The target 17 was prepared from a Bi-based superconductor ($Bi_2Sr_2Ca_2Cu_3O_y$) in accordance with the foregoing description.

After introducing argon and oxygen at $Ar:O_2=4:1$ and maintaining the whole pressure at 0.1 Torr, the target 17 was slowly disintegrated due to bombardment by laser rays and the material of the target was deposited on the substrate 15 of $Bi_2Sr_4Fe_3O_y$. The substrate temperature was adjusted at 650° C. by means of the heater. Through the measurement of resistivity, Tc was measured to be 106K. This Tc was attributed to the high Tc phase.

While several embodiments have been specifically described by way of examples, it is to be appreciated that the present invention is not limited to the particular examples described and that modifications and variations can be made without departing from the scope of the invention as defined by the appended claims. Some examples are as follow.

Although three methods were employed for forming superconductor on the substrates in the foregoing embodiments, the superconducting film, the superconductor can be formed by other methods which have been used for forming superconducting ceramics such as vacuum evaporation, reactive evaporation, chemical vapor reations, spray pyrolysis.

What is claimed is:

1. A method of manufacturing crystalline Bi-based superconducting ceramic comprising the step of:
   preparing a seed crystal of a non-superconducting Bi-based oxide ceramic which has a similar crystalline structure as the superconducting ceramic to be manufactured by this method; and
   forming the Bi-based superconducting ceramic on said seed crystal by a crystal pulling method;
   wherein an a-axis length and a b-axis length of said seed crystal are substantially equal to those of said superconducting ceramic;
   whereby the seed crystal has a c-axis length which results in a simple ratio with respect to the c-axis length of the superconducting ceramic material.

2. The method of claim 1 wherein said Bi-based seed crystal comprises a material selected among from the group consisting of $Bi_3TiNbO_9$, $Bi_3TiTaO_9$, $Bi_3Ti_4NbO_9$, $CaBi_2Nb_2O_9$, $Bi_3TiTaO_9$, $CaBi_2Ta_2O_9$, $SrBi_2Nb_2O_9$, $SrBi_2Ta_2O_9$, $Ba_2Bi_2Nb_2O_9$, $CaSr_2Bi_4Ti_5O_{18}$, $Sr_2Bi_4Ti_5O_{18}$, $Ba_2Bi_4Ti_5O_{18}$ and $Pb_2Bi_4Ti_5O_{18}$.

3. The method of claim 1 wherein the c-axis length of said Bi-based oxide ceramic seed crystal approximates that of said superconducting ceramic.

4. A method of forming a Bi-based superconducting ceramic comprising the step of:
   preparing a Bi-based seed crystal which is represented by the general formula $(Bi_2O_2)(A_{m-}B_mO_{3m+1})$ where A stands for an alkaline earth metal, B stands for a rare earth and $m > 1$; and
   forming the Bi-based superconducting ceramic on said seed crystal by a crystal pulling technique, wherein said Bi-based seed crystal comprises a material selected among from the group consisting of $Bi_3TiNbO_9$, $Bi_3TiTaO_9$, $Bi_3Ti_4NbO_9$, $CaBi_2Nb_2O_9$, $Bi_3TiTaO_9$, $CaBi_2Ta_2O_9$, $SrBi_2Nb_2O_9$, $SrBi_2Ta_2O_9$, $Ba_2Bi_2Nb_2O_9$, $CaSr_2Bi_4Ti_5O_{18}$, $Sr_2Bi_4Ti_5O_{18}$, $Ba_2Bi_4Ti_5O_{18}$ and $Pb_2Bi_4Ti_5O_{18}$.

* * * * *